(12) United States Patent
Komori et al.

(10) Patent No.: US 7,663,440 B2
(45) Date of Patent: Feb. 16, 2010

(54) AMPLIFIER CIRCUIT, SEMICONDUCTOR DEVICE, AND CONTROLLING METHOD

(75) Inventors: Kenji Komori, Kanagawa (JP); Atsushi Hirabayashi, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/985,970

(22) Filed: Nov. 19, 2007

(65) Prior Publication Data

US 2008/0136524 A1    Jun. 12, 2008

(30) Foreign Application Priority Data

Dec. 6, 2006   (JP)   ............................ P2006-329074

(51) Int. Cl.
*H03F 3/16* (2006.01)
*H03F 3/68* (2006.01)

(52) U.S. Cl. ........................ 330/277; 330/295

(58) Field of Classification Search ................ 330/277, 330/295; 327/333

See application file for complete search history.

(56) References Cited

U.S. PATENT DOCUMENTS 4,169,233 A * 9/1979 Haraszti ...................... 327/57
2006/0244504 A1 * 11/2006 Kawabe ...................... 327/291

FOREIGN PATENT DOCUMENTS

JP    2003-163550    6/2003

* cited by examiner

*Primary Examiner*—Steven J Mottola
(74) *Attorney, Agent, or Firm*—Robert J. Depke; Rockey, Depke & Lyons, LLC

(57) ABSTRACT

An amplifier circuit including a plurality of CMOS (Complementary Metal Oxide Semiconductor) inverter circuits connected in parallel with each other. The CMOS inverter circuits each include a first PMOS (P-channel Metal Oxide Semiconductor) transistor, a first NMOS (N-channel Metal Oxide Semiconductor) transistor, gates of the first PMOS and NMOS transistors, a second PMOS transistor, a first switch connected to a gate of the second PMOS transistor, a second NMOS transistor, and a second switch connected to a gate of the second NMOS transistor.

14 Claims, 9 Drawing Sheets

US 7,663,440 B2

AMPLIFIER CIRCUIT, SEMICONDUCTOR DEVICE, AND CONTROLLING METHOD

CROSS REFERENCES TO RELATED APPLICATIONS

The present invention contains subject matter related to Japanese Patent Application JP 2006-329074, filed in the Japan Patent Office on Dec. 6, 2006, the entire contents of which being incorporated herein by reference.

BACKGROUND OF THE INVENTION

1. Field of the Invention

The present invention relates to an amplifier circuit, a semiconductor device, and a controlling method, and particularly to an amplifier circuit, a semiconductor device, and a controlling method that eliminate a DC (Direct Current) offset caused by variations in device characteristics of a PMOS (P-channel Metal Oxide Semiconductor) transistor and an NMOS (N-channel Metal Oxide Semiconductor) transistor forming a CMOS (Complementary Metal Oxide Semiconductor), which variations occur in each manufacturing process, and which can control gain.

2. Description of the Related Art

Recently, as the manufacturing of digital devices has increased with the progress of digital signal processing technology, a CMOS integrated circuit has been widely used in a semiconductor device provided within a digital device.

However, a high-frequency signal, a video signal, an audio signal and the like may be more easily processed as an analog signal. In addition, analog signal processing is necessary to implement an A/D (Analog/Digital) converter circuit, a D/A (Digital/Analog) converter circuit, a clock transmitting circuit, and the like.

An amplifier circuit using a CMOS inverter circuit is suitable as a circuit for the above-mentioned analog signal processing because the amplifier circuit offers high gain performance with a simple configuration. On the other hand, to use an output DC bias in an optimum state may require that operating parameters such as threshold voltage, saturation current and the like of a PMOS transistor and an NMOS transistor forming a CMOS inverter circuit perfectly coincide with each other. However, it may be impossible to make the operating parameters of the PMOS transistor and the NMOS transistor perfectly coincide with each other for manufacturing reasons, so that a circuit device may be required.

Accordingly, the present applicant has previously proposed an amplifier circuit that can control gain in a CMOS inverter circuit by setting output bias potential to an optimum value and varying bias current (for example, see Japanese Patent Laid-open No. 2003-163550, hereinafter referred to as Patent Document 1).

In the Patent Document 1, as shown in FIG. 1, an amplifier circuit 1 includes two CMOS inverter circuits, that is, a CMOS inverter circuit (hereinafter referred to as a first CMOS inverter circuit) including a PMOS transistor $Qp_1$, a PMOS transistor $Qp_2$, an NMOS transistor $Qn_1$, and an NMOS transistor $Qn_2$, and a CMOS inverter circuit (hereinafter referred to as a second CMOS inverter circuit) as a circuit for reference formed in the same manner as the first CMOS inverter circuit, the second CMOS inverter circuit including a PMOS transistor $Qp_3$, a PMOS transistor $Qp_4$, an NMOS transistor $Qn_3$, and an NMOS transistor $Qn_4$.

The amplifier circuit 1 of FIG. 1 outputs a signal voltage Vin input from a signal source 13 to an input terminal 11 as an output voltage Vout from an output terminal 12. That is, in FIG. 1, the input terminal 11 is connected to the signal source 13 and a part connecting the gate of the PMOS transistor $Qp_1$ and the gate of the NMOS transistor $Qn_1$ to each other. The output terminal 12 is connected to a part connecting the drain of the PMOS transistor $Qp_1$ and the drain of the NMOS transistor $Qn_1$ to each other.

A bias voltage source Ea is a voltage source for applying a bias voltage Vg. The bias voltage source Ea has one terminal thereof connected to the signal source 13, and has another terminal thereof connected to a ground GND (that is, grounded). A voltage source Eb is set virtually so as to apply a bias voltage occurring on an output side in performing analysis of an alternating-current signal. The voltage source Eb has one terminal thereof connected to a load resistance R0, and has another terminal thereof connected to the ground GND.

An operational amplifier 14 has a non-inverting input terminal (+) connected to a part connecting the drain of the PMOS transistor $Qp_3$ and the drain of the NMOS transistor $Qn_3$ to each other, an inverting input terminal (−) thereof connected to a part connecting the gate of the PMOS transistor $Qp_3$ and the gate of the NMOS transistor $Qn_3$ to each other, and an output terminal thereof connected to the gate of the NMOS transistor $Qn_2$ and the gate of the NMOS transistor $Qn_4$. Incidentally, an NMOS transistor $Qn_5$ is provided to prevent a latch-up phenomenon occurring at a time of power startup.

In the amplifier circuit 1 of FIG. 1, a power supply voltage is represented as Vdd; a bias voltage applied by a bias voltage source Ec is represented as Vg; a voltage applied by a variable voltage source Ed is represented as Vc; a source potential of the PMOS transistor $Qp_1$ and the PMOS transistor $Qp_2$ and a source potential of the PMOS transistor $Qp_3$ and the PMOS transistor $Qp_4$ are represented as Vsp; and an output voltage of the operational amplifier 14 is represented as Vn.

That is, in the amplifier circuit 1 of FIG. 1, the same control voltage Vc (the voltage from the variable voltage source Ed) is applied to the gates of the PMOS transistor $Qp_2$ and the PMOS transistor $Qp_4$. The same voltage Vn for adjustment (the output voltage from the operational amplifier 14) is applied to the gates of the NMOS transistor $Qn_2$ and the NMOS transistor $Qn_4$.

Thus, the amplifier circuit 1 of FIG. 1 can control operating current flowing through the PMOS transistor $Qp_1$ and the NMOS transistor $Qn_1$ forming a CMOS inverter by the control voltage Vc supplied to the gate of the PMOS transistor $Qp_2$.

In addition, because the operating parameters such as threshold voltage, saturation current and the like of the PMOS transistor $Qp_1$ and the NMOS transistor $Qn_1$ do not coincide with each other for reasons of variations in manufacturing and the like, an DC offset as an error of an output DC bias of the second CMOS inverter circuit having the same form as the first CMOS inverter circuit from an optimum bias state (for example an intermediate voltage between a GND voltage and a Vdd voltage) is detected, and the gate voltage (the voltage Vn for adjustment) of the NMOS transistor $Qn_4$ is set so as to minimize the DC offset.

The gate voltage set in the NMOS transistor $Qn_4$ forming the second inverter circuit is supplied as gate voltage to the NMOS transistor $Qn_2$ forming the first CMOS inverter circuit, whereby an output DC bias of the first CMOS inverter circuit is set in an optimum bias state.

As described above, the amplifier circuit 1 of FIG. 1 can control gain by setting the output bias potential to an optimum value and making the operating current variable.

SUMMARY OF THE INVENTION

However, although the amplifier circuit 1 of FIG. 1 can control gain by setting the output bias potential to an optimum value and making the bias current variable, the operating current is varied greatly in order to obtain necessary gain because of MOS variations at the time of manufacturing.

Therefore, when the direction of the MOS variations decreases current, the distortion of an output signal is increased. When the amplifier circuit 1 of FIG. 1 is used as an amplifier in an RF (Radio Frequency) system, for example, there is a fear of characteristic deterioration such as deterioration of cross modulation characteristics or the like. In addition, when a high operating current is made to flow in order to reduce noise and distortion, there arises a need to increase the size of the constituent MOS transistors.

When, for example, circuit constants are set according to the worst condition, and the direction of the MOS variations conversely increases current, with the size unchanged, there is a fear of higher current than is necessary flowing and thus inviting an increase in power consumption.

The present invention has been made in view of such a situation. It is desirable to correct MOS variations at the time of manufacturing by controlling offset current and gain.

According to a first embodiment of the present invention, there is provided an amplifier circuit including a plurality of CMOS inverter circuits connected in parallel with each other. The CMOS inverter circuits each include a first PMOS transistor, a first NMOS transistor having a drain connected to a drain of the first PMOS transistor, a gate of the first PMOS transistor and a gate of the first NMOS transistor being connected to an input terminal, and the drain of the first PMOS transistor and the drain of the first NMOS transistor being connected to an output terminal. The CMOS inverter circuits each further include a second PMOS transistor having a drain connected to a source of the first PMOS transistor, and having a source connected to a power supply voltage source, a first switch connected to a gate of the second PMOS transistor, the first switch changing a gate voltage of the second PMOS transistor to one of a power supply voltage and a first operating voltage, and a second NMOS transistor having a drain connected to a source of the first NMOS transistor, and having a source connected to a ground. The CMOS inverter circuits each further include a second switch connected to a gate of the second NMOS transistor, the second switch changing a gate voltage of the second NMOS transistor to one of a potential of the ground and a second operating voltage, and the first switch and the second switch perform switching operation so as to eliminate an imbalance between first operating currents of the PMOS transistors and second operating currents of the NMOS transistors in the plurality of CMOS inverter circuits.

The first switch and the second switch can perform switching operation so as to minimize a value of offset current as a difference between a value of a current sum of the first operating currents and a value of a current sum of the second operating currents.

The first switch and the second switch can perform switching operation so as to optimize a value of mutual conductance obtained by adding together a value of a sum of mutual conductances of the PMOS transistors and a value of a sum of mutual conductances of the NMOS transistors in the plurality of CMOS inverter circuits.

The amplifier circuit can further include a bias current setting unit for setting a bias current by applying the first operating voltage, and a DC offset correcting unit for correcting a DC offset by applying the second operating voltage.

The amplifier circuit can further include a DC offset correcting unit for correcting a DC offset by applying the first operating voltage, and a bias current setting unit for setting a bias current by applying the second operating voltage.

The bias current setting unit can be formed by a variable voltage source disposed between the gate of the second PMOS transistor and the power supply voltage source, and when the first switch is changed to a side of the variable voltage source, the variable voltage source can apply a variable voltage to the gate of the second PMOS transistor as the first operating voltage.

The DC offset correcting unit can be formed by a filter for removing high frequencies and an operational amplifier, and when the second switch is changed to a side of the operational amplifier, the operational amplifier can compare a level of a voltage extracted by the filter with a level of a voltage applied by a reference voltage source, and apply a voltage having a level representing a result of comparison to the gate of the second NMOS transistor as the second operating voltage.

The DC offset correcting unit can be formed by a filter for removing high frequencies and an operational amplifier, and when the first switch is changed to a side of the operational amplifier, the operational amplifier can compare a level of a voltage extracted by the filter with a level of a voltage applied by a reference voltage source, and apply a voltage having a level representing a result of comparison to the gate of the second PMOS transistor as the first operating voltage.

The bias current setting unit can be formed by a variable voltage source disposed between the gate of the second NMOS transistor and the ground, and when the second switch is changed to a side of the variable voltage source, the variable voltage source can apply a variable voltage to the gate of the second NMOS transistor as the second operating voltage.

The amplifier circuit can further include a feedback resistance for reducing an offset between the input terminal and the output terminal.

In the first embodiment of the present invention, the first switch and the second switch perform switching operation so as to eliminate an imbalance between the first operating currents of the PMOS transistors and the second operating currents of the NMOS transistors in the plurality of CMOS inverter circuits.

According to a second embodiment of the present invention, there is provided a semiconductor device including: the amplifier circuit; a measuring unit for measuring an output from the amplifier circuit; and a controlling unit for controlling the switching operation of the first switch and the second switch so as to eliminate an imbalance between the first operating currents of the PMOS transistors and the second operating currents of the NMOS transistors in the plurality of CMOS inverter circuits on a basis of the measured output.

The controlling unit can control the switching operation of the first switch and the second switch so as to minimize a value of offset current as a difference between a value of a current sum of the first operating currents and a value of a current sum of the second operating currents.

The controlling unit can control the switching operation of the first switch and the second switch so as to optimize a value of mutual conductance obtained by adding together a value of a sum of mutual conductances of the PMOS transistors and a value of a sum of mutual conductances of the NMOS transistors in the plurality of CMOS inverter circuits.

According to the second embodiment of the present invention, there is provided a controlling method of a semiconductor device, the semiconductor device including the amplifier circuit. The controlling method includes the steps of: measuring an output from the amplifier circuit; and controlling the switching operation of the first switch and the second switch so as to eliminate an imbalance between the first operating currents of the PMOS transistors and the second operating currents of the NMOS transistors in the plurality of CMOS inverter circuits on a basis of the measured output.

In the second embodiment of the present invention, an output from the amplifier circuit is measured, and the switching operation of the first switch and the second switch is controlled so as to eliminate an imbalance between the first operating currents of the PMOS transistors and the second operating currents of the NMOS transistors in the plurality of CMOS inverter circuits forming the amplifier circuit on the basis of the measured output.

As described above, according to the first embodiment of the present invention, it is possible to correct the MOS variations at the time of manufacturing by controlling offset current and gain.

As described above, according to the second embodiment of the present invention, it is possible to correct the MOS variations at the time of manufacturing by controlling the switching operation of the switches provided in the amplifier circuit and controlling offset current and gain.

DETAILED DESCRIPTION OF THE PREFERRED EMBODIMENTS

Figure 1:
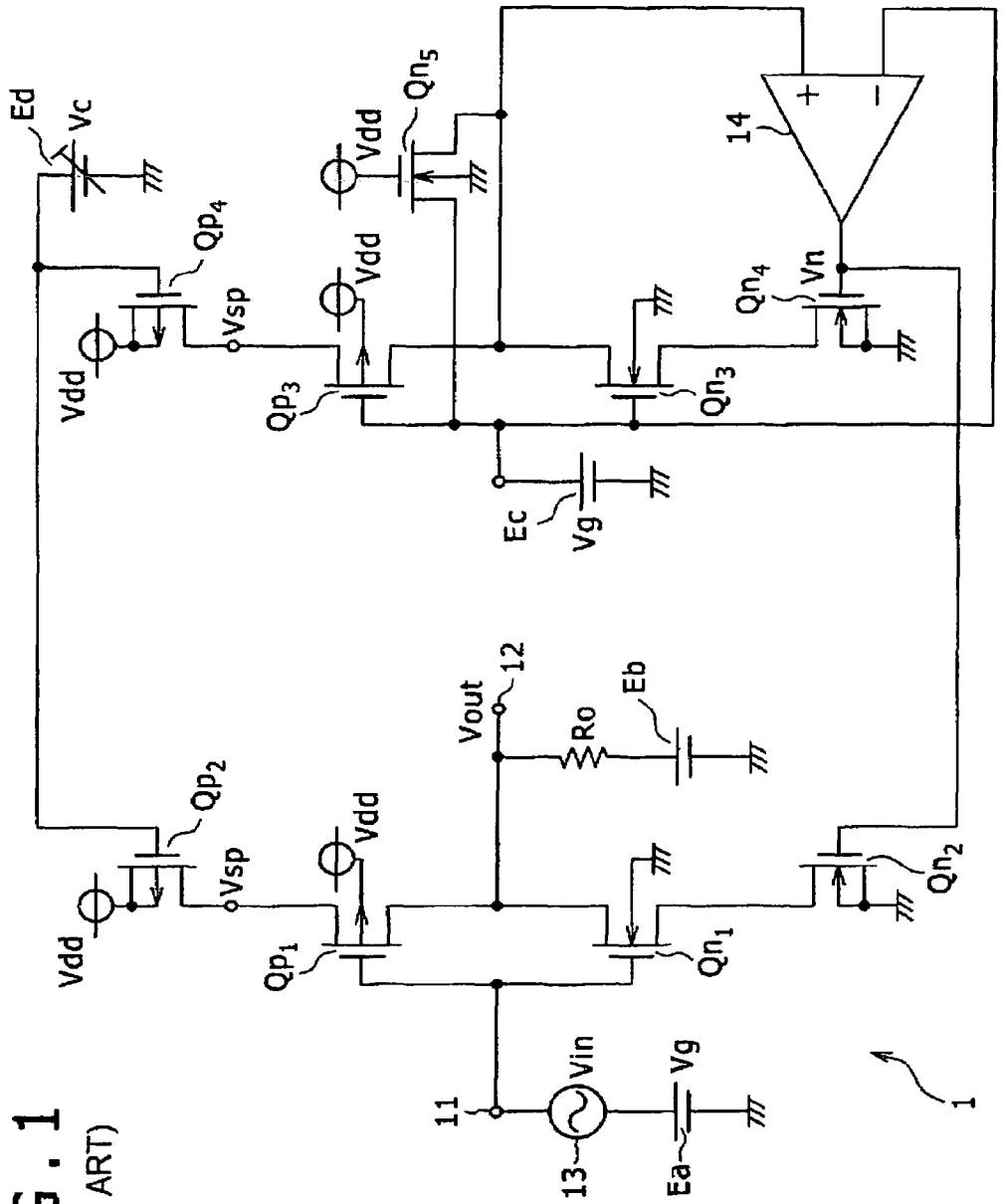
FIG. 1 is a circuit diagram showing a configuration of a conventional amplifier circuit.

Preferred embodiments of the present invention will hereinafter be described. Correspondences between constitutional requirements of the present invention and embodiments described in the specification or the drawings are illustrated as follows. This description is to confirm that embodiments supporting the present invention are described in the specification or the drawings. Therefore, even when there is an embodiment described in the specification or drawings but not described here as an embodiment corresponding to a constitutional requirement of the present invention, it does not signify that the embodiment does not correspond to the constitutional requirement. Conversely, even when an embodiment is described here as corresponding to a constitutional requirement, it does not signify that the embodiment does not correspond to constitutional requirements other than that constitutional requirement.

An amplifier circuit (for example an amplifier circuit 112 in FIG. 2) according to a first embodiment of the present invention includes a plurality of CMOS inverter circuits (for example a first CMOS pair to an nth CMOS pair in FIG. 3) connected in parallel with each other, wherein the CMOS inverter circuits each include a first PMOS transistor (for example PMOS transistors $Qp_{11}$ to $Qp_{1n}$ in FIG. 3), a first NMOS transistor (for example, NMOS transistors $Qn_{11}$ to $Qn_{1n}$ in FIG. 3) having a drain connected to a drain of the first PMOS transistor, a gate of the first PMOS transistor and a gate of the first NMOS transistor being connected to an input terminal (for example an input terminal 121 in FIG. 3), and the drain of the first PMOS transistor and the drain of the first NMOS transistor being connected to an output terminal (for example an output terminal 122 in FIG. 3), a second PMOS transistor (for example PMOS transistors $Qp_{21}$ to $Qp_{2n}$ in FIG. 3) having a drain connected to a source of the first PMOS transistor, and having a source connected to a power supply voltage source, a first switch (for example first switches $SW_{11}$ to $SW_{1n}$ in FIG. 3) connected to a gate of the second PMOS transistor, the first switch changing a gate voltage of the second PMOS transistor to one of a power supply voltage and a first operating voltage, a second NMOS transistor (for example NMOS transistors $Qn_{21}$ to $Qn_{2n}$ in FIG. 3) having a drain connected to a source of the first NMOS transistor, and having a source connected to a ground, and a second switch (for example second switches $SW_{21}$ to $SW_{2n}$ in FIG. 3) connected to a gate of the second NMOS transistor, the second switch changing a gate voltage of the second NMOS transistor to one of a potential of the ground and a second operating voltage, and the first switch and the second switch perform switching operation so as to eliminate an imbalance between first operating currents of the PMOS transistors and second operating currents of the NMOS transistors in the plurality of CMOS inverter circuits.

The first switch and the second switch can perform switching operation so as to minimize a value of offset current as a difference between a value of a current sum of the first operating currents and a value of a current sum of the second operating currents.

The first switch and the second switch can perform switching operation so as to optimize a value of mutual conductance obtained by adding together a value of a sum of mutual conductances of the PMOS transistors and a value of a sum of mutual conductances of the NMOS transistors in the plurality of CMOS inverter circuits.

The amplifier circuit can further include bias current setting means (for example a bias current setting unit 131 in FIG. 4) for setting a bias current by applying the first operating voltage, and DC offset correcting means (for example a DC offset correcting unit 132 in FIG. 4) for correcting a DC offset by applying the second operating voltage.

The amplifier circuit can further include DC offset correcting means (for example a DC offset correcting unit 141 in FIG. 5) for correcting a DC offset by applying the first operating voltage, and bias current setting means (for example a bias current setting unit 142 in FIG. 5) for setting a bias current by applying the second operating voltage.

The bias current setting means can be formed by a variable voltage source disposed between the gate of the second PMOS transistor and the power supply voltage source, and when the first switch is changed to a side of the variable voltage source, the variable voltage source can apply a variable voltage to the gate of the second PMOS transistor as the first operating voltage.

The DC offset correcting means can be formed by a filter for removing high frequencies and an operational amplifier, and when the second switch is changed to a side of the operational amplifier, the operational amplifier can compare a level of a voltage extracted by the filter with a level of a voltage applied by a reference voltage source, and apply a voltage having a level representing a result of comparison to the gate of the second NMOS transistor as the second operating voltage.

The DC offset correcting means can be formed by a filter for removing high frequencies and an operational amplifier, and when the first switch is changed to a side of the operational amplifier, the operational amplifier can compare a level of a voltage extracted by the filter with a level of a voltage applied by a reference voltage source, and apply a voltage having a level representing a result of comparison to the gate of the second PMOS transistor as the first operating voltage.

The bias current setting means can be formed by a variable voltage source disposed between the gate of the second NMOS transistor and the ground, and when the second switch is changed to a side of the variable voltage source, the variable voltage source can apply a variable voltage to the gate of the second NMOS transistor as the second operating voltage.

The amplifier circuit can further include a feedback resistance (for example a resistance R0 in FIG. 3) for reducing an offset between the input terminal and the output terminal.

A semiconductor device (for example a semiconductor device 101 in FIG. 2) according to a second embodiment of the present invention includes: the amplifier circuit (for example the amplifier circuit 112 in FIG. 2); measuring means (for example a measuring unit 113 in FIG. 2) for measuring an output from the amplifier circuit; and controlling means (for example an adjustment controlling unit 114 in FIG. 2) for controlling the switching operation of the first switch and the second switch so as to eliminate an imbalance between the first operating currents of the PMOS transistors and the second operating currents of the NMOS transistors in the plurality of CMOS inverter circuits on a basis of the measured output.

The controlling means can control the switching operation of the first switch and the second switch so as to minimize a value of offset current as a difference between a value of a current sum of the first operating currents and a value of a current sum of the second operating currents.

The controlling means can control the switching operation of the first switch and the second switch so as to optimize a value of mutual conductance obtained by adding together a value of a sum of mutual conductances of the PMOS transistors and a value of a sum of mutual conductances of the NMOS transistors in the plurality of CMOS inverter circuits.

Figure 8:
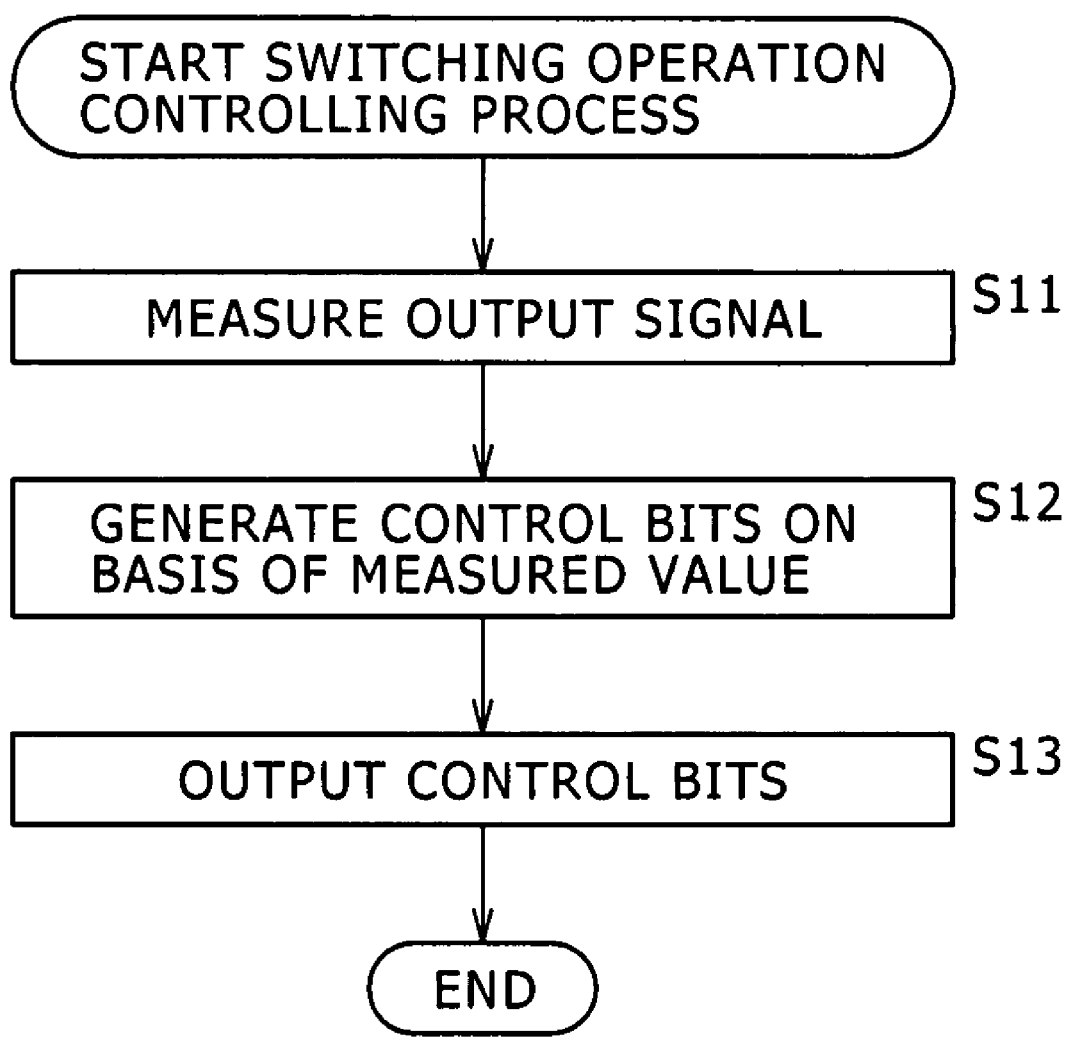
FIG. 8 is a flowchart of assistance in explaining a process of controlling switching operation.

A controlling method according to the second embodiment of the present invention is a controlling method of a semiconductor device, the semiconductor device including the amplifier circuit, the controlling method including the steps of: measuring an output from the amplifier circuit (for example a process of step S11 in FIG. 8); and controlling the switching operation of the first switch and the second switch so as to eliminate an imbalance between the first operating currents of the PMOS transistors and the second operating currents of the NMOS transistors in the plurality of CMOS inverter circuits on a basis of the measured output (for example a process of step S12 and step S13 in FIG. 8).

Preferred embodiments of the present invention will hereinafter be described with reference to the drawings.

Figure 2:
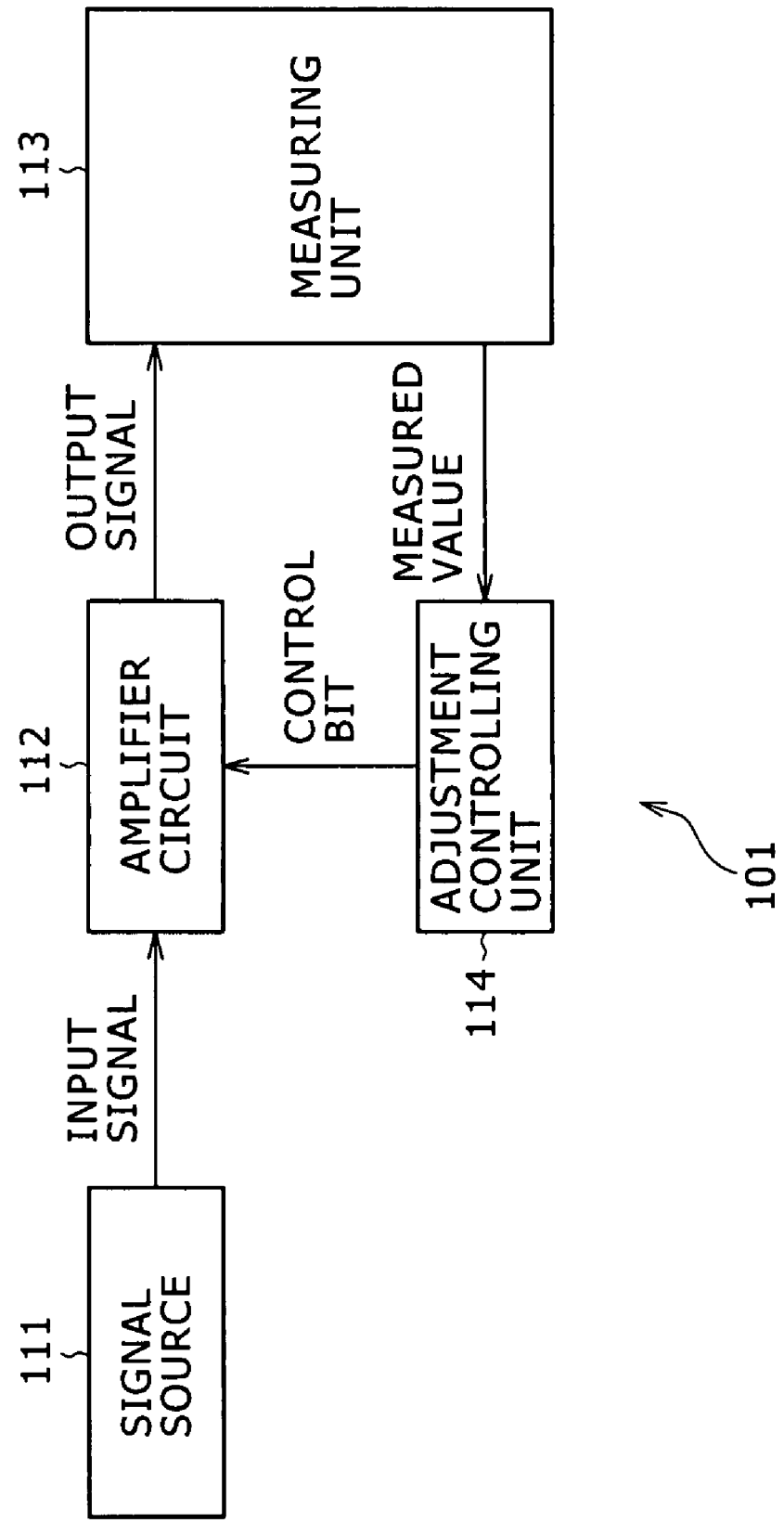
FIG. 2 is a block diagram showing a configuration of an embodiment of a semiconductor device to which the present invention is applied.

FIG. 2 is a block diagram showing a configuration of an embodiment of a semiconductor device 101 to which the present invention is applied. The semiconductor device 101 includes a signal source 111, an amplifier circuit 112, a measuring unit 113, and an adjustment controlling unit 114.

The amplifier circuit 112 includes a plurality of CMOS inverter circuits. The amplifier circuit 112 amplifies an input signal input from the signal source 111, and then outputs the amplified signal to the measuring unit 113. Incidentally, details of the amplifier circuit 112 will be described later with reference to FIGS. 3 to 7.

The measuring unit 113 is formed as an ammeter, for example. The measuring unit 113 measures currents flowing through PMOS transistors and NMOS transistors forming the plurality of CMOS inverter circuits of the amplifier circuit 112 from the output (output signal) by the amplifier circuit 112. The measuring unit 113 supplies a measured value obtained by measuring the currents to the adjustment controlling unit 114.

The adjustment controlling unit 114 supplies the amplifier circuit 112 with for example a signal (hereinafter referred to as control bits) for performing control so as to eliminate an imbalance between currents flowing through the PMOS transistors forming the plurality of CMOS inverter circuits of the amplifier circuit 112 and currents flowing through the NMOS transistors on the basis of the measured value supplied from the measuring unit 113. Specifically, for example, the adjustment controlling unit 114 supplies the amplifier circuit 112 with the control bits for minimizing an offset current of the CMOS inverter circuits.

Then, the amplifier circuit 112 operates so as to eliminate an imbalance between the currents flowing through the PMOS transistors forming the plurality of CMOS inverter circuits and the currents flowing through the NMOS transistors on the basis of the control bits supplied from the adjustment controlling unit 114.

Incidentally, the above-described control bits for performing control so as to eliminate an imbalance between the currents flowing through the PMOS transistors forming the plurality of CMOS inverter circuits and the currents flowing through the NMOS transistors is for example a signal for performing control so as to minimize the value of the offset current as a difference between the value of a current sum of the operating currents of the PMOS transistors and the value of a current sum of the operating currents of the NMOS transistors or a signal for performing control so as to optimize the value of mutual conductance of the PMOS transistors and the NMOS transistors. In addition, the control bits may of course be a signal that minimizes the offset current and optimizes the mutual conductance.

Details of the amplifier circuit 112 operating on the basis of the control bits from the adjustment controlling unit 114 will next be described with reference to circuit diagrams of FIGS. 3 to 7.

Figure 3:
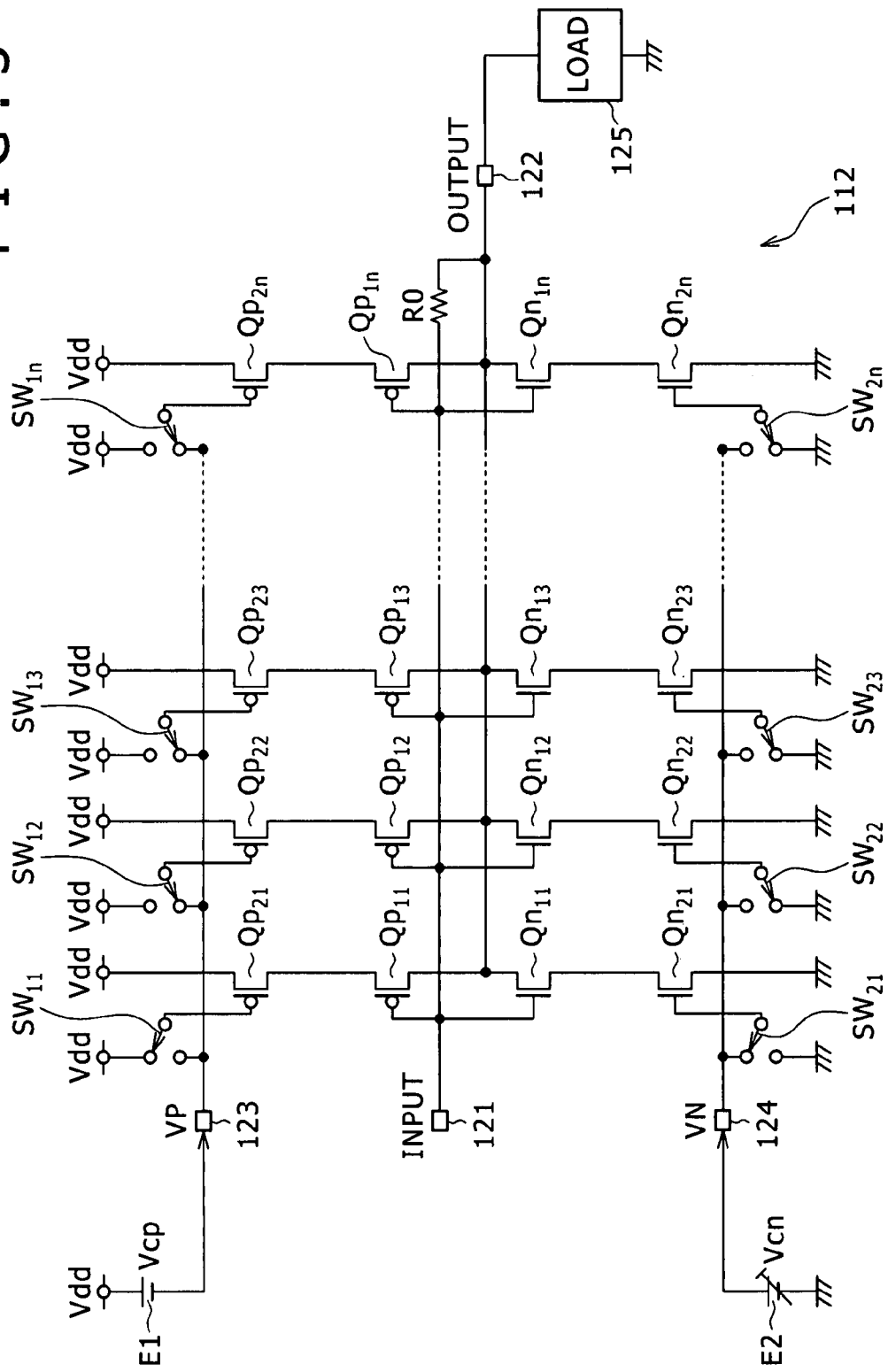
FIG. 3 is a circuit diagram showing an example of a detailed configuration of the amplifier circuit of FIG. 2.

FIG. 3 is a circuit diagram showing an example of a detailed configuration of the amplifier circuit 112 in FIG. 2.

The amplifier circuit 112 includes PMOS transistors $Qp_{11}$ to $Qp_{1n}$, NMOS transistors $Qn_{11}$ to $Qn_{1n}$, PMOS transistors $QP_{21}$ to $QP_{2n}$, NMOS transistors $Qn_{21}$ to $Qn_{2n}$, switches $SW_{11}$ to $SW_{1n}$, switches $SW_{21}$ to $SW_{2n}$, a variable voltage source E1, a variable voltage source E2, a resistance R0, an input terminal (INPUT) 121, an output terminal (OUTPUT) 122, a terminal 123, and a terminal 124.

As shown in FIG. 3, in the amplifier circuit 112, let Vdd be a power supply voltage from a power supply voltage source (not shown), Vcp be a voltage applied by the variable voltage source E1, and Vcn be a voltage applied by the variable voltage source E2. That is, the voltage Vcp from the variable voltage source E1 is input as a PMOS bias setting voltage VP to the terminal 123, and the voltage Vcn from the variable voltage source E2 is input as an NMOS bias setting voltage VN to the terminal 124. In other words, it can be said that the variable voltage source E1 between the terminal 123 and the power supply voltage source (Vdd) applies the voltage Vcp to the terminal 123, and the variable voltage source E2 between the terminal 124 and a ground (GND) applies the voltage Vcn to the terminal 124, whereby necessary bias current is set.

The PMOS transistor $Qp_{11}$ and the NMOS transistor $Qn_{11}$ are formed as one pair of a CMOS inverter circuit in the example of FIG. 3. The PMOS transistor $Qp_{11}$ has a gate thereof connected to the gate of the NMOS transistor $Qn_{11}$, and has a drain thereof connected to the drain of the NMOS transistor $Qn_{11}$. That is, the gates and the drains of the PMOS transistor $Qp_{11}$ and the NMOS transistor $Qn_{11}$ are connected to each other.

In addition, the PMOS transistor $Qp_{21}$ is connected between the source of the PMOS transistor $Qp_{11}$ and the power supply voltage source (Vdd). The PMOS transistor $Qp_{21}$ has a gate thereof connected to the switch $SW_{11}$ for selecting the voltage Vdd or VP (PMOS bias setting voltage) and thereby changing a gate voltage, has a drain thereof connected to the source of the PMOS transistor $Qp_{11}$, and has a source thereof connected to the power supply voltage source (Vdd).

The switch $SW_{11}$ performs switching operation according to a control bit from the adjustment controlling unit 114 to supply the voltage Vdd or VP as the gate voltage to the gate of the PMOS transistor $Qp_{21}$. That is, the voltage Vdd or VP is input as the gate voltage to the gate of the PMOS transistor $Qp_{21}$ according to the switching operation of the switch $SW_{11}$.

Further, the NMOS transistor $Qn_{21}$ is connected between the source of the NMOS transistor $Qn_{11}$ and the ground (GND). The NMOS transistor $Qn_{21}$ has a gate thereof connected to the switch $SW_{21}$ for selecting the potential of the ground GND or the voltage VN (NMOS bias setting voltage) and thereby changing a gate voltage, has a drain thereof connected to the source of the NMOS transistor $Qn_{11}$, and has a source thereof connected to the ground GND (that is, grounded).

The switch $SW_{21}$ performs switching operation according to a control bit from the adjustment controlling unit 114 to supply the potential of the ground GND or the voltage VN to the gate of the NMOS transistor $Qn_{21}$. That is, the potential of the ground GND or the voltage VN is input as gate voltage to the gate of the NMOS transistor $Qn_{21}$ according to the switching operation of the switch $SW_{21}$.

Incidentally, a circuit formed by the PMOS transistor $Qp_{11}$, the NMOS transistor $Qn_{11}$, the PMOS transistor $Qp_{21}$, the NMOS transistor $Qn_{21}$, the switch $SW_{11}$, and the switch $SW_{21}$ forms a CMOS pair as a first set in FIG. 3, and thus will hereinafter be referred to as a first CMOS pair.

In the first CMOS pair, when the switch $SW_{11}$ is changed to the voltage VP side, a current flows through the PMOS transistors, and when the switch $SW_{11}$ is changed to the voltage Vdd side, no current flows through the PMOS transistors. When the switch $SW_{21}$ is changed to the voltage VN side, a current flows through the NMOS transistors, and when the switch $SW_{21}$ is changed to the ground GND side, no current flows through the NMOS transistors.

In the example of FIG. 3, as with the first CMOS pair, a second CMOS pair, which is a CMOS pair as a second set, includes the PMOS transistor $Qp_{12}$, the NMOS transistor $Qn_{12}$, the PMOS transistor $Qp_{22}$, the NMOS transistor $Qn_{22}$, the switch $SW_{12}$, and the switch $SW_{22}$.

In the second CMOS pair, as in the first CMOS pair, the PMOS transistor $Qp_{12}$ and the NMOS transistor $Qn_{12}$ are formed as one pair of a CMOS inverter circuit. The PMOS transistor $Qp_{22}$ is connected between the source of the PMOS transistor $Qp_{12}$ and the power supply voltage source (Vdd). The NMOS transistor $Qn_{22}$ is connected between the source of the NMOS transistor $Qn_{12}$ and the ground GND.

The PMOS transistor $Qp_{22}$ has a gate thereof connected to the switch $SW_{12}$, has a drain thereof connected to the source of the PMOS transistor $Qp_{12}$, and has a source thereof connected to the power supply voltage source (Vdd). The switch $SW_{12}$ performs switching operation according to a control bit from the adjustment controlling unit 114 to supply the voltage Vdd or VP as gate voltage to the gate of the PMOS transistor $Qp_{22}$.

The NMOS transistor $Qn_{22}$ has a gate thereof connected to the switch $SW_{22}$, has a drain thereof connected to the source of the NMOS transistor $Qn_{12}$, and has a source thereof connected to the ground GND. The switch $SW_{22}$ performs switching operation according to a control bit from the adjustment controlling unit 114 to supply the potential of the ground GND or the voltage VN to the gate of the NMOS transistor $Qn_{22}$.

That is, in the second CMOS pair, when the switch $SW_{12}$ is changed to the voltage VP side, current flows through the PMOS transistors, and when the switch $SW_{12}$ is changed to the voltage Vdd side, no current flows through the PMOS transistors. When the switch $SW_{22}$ is changed to the voltage VN side, current flows through the NMOS transistors, and when the switch $SW_{22}$ is changed to the ground GND side, no current flows through the NMOS transistors.

Further, in a third CMOS pair to an nth CMOS pair (n is a natural number), as in the first CMOS pair, the PMOS transistors $Qp_{13}$ to $Qp_{1n}$ and the NMOS transistors $Qn_{13}$ to $Qn_{1n}$ are respectively formed as one pair of a CMOS inverter circuit. The PMOS transistors $Qp_{23}$ to $Qp_{2n}$ are respectively connected between the sources of the PMOS transistors $Qp_{13}$ to $Qp_{1n}$ and the power supply voltage source (Vdd). The NMOS transistors $Qn_{23}$ to $Qn_{2n}$ are respectively connected between the sources of the NMOS transistors $Qn_{13}$ to $Qn_{1n}$ and the ground GND.

The PMOS transistors $Qp_{23}$ to $Qp_{2n}$ have gates thereof connected to the switches $SW_{13}$ to $SW_{1n}$, respectively, have drains thereof connected to the sources of the PMOS transistors $Qp_{13}$ to $QP_{1n}$, respectively, and have sources thereof each connected to the power supply voltage source (Vdd). The switches $SW_{13}$ to $SW_{1n}$ respectively perform switching operation according to control bits from the adjustment controlling unit 114 to supply the voltage Vdd or VP as gate voltage to the gates of the PMOS transistors $Qp_{23}$ to $Qp_{2n}$.

The NMOS transistors $Qn_{23}$ to $Qn_{2n}$ have gates thereof connected to the switches $SW_{23}$ to $SW_{2n}$, respectively, have drains thereof connected to the sources of the NMOS transistors $Qn_{13}$ to $Qn_{1n}$, respectively, and have sources thereof each connected to the ground GND. The switches $SW_{23}$ to $SW_{2n}$ respectively perform switching operation according to control bits from the adjustment controlling unit 114 to supply the potential of the ground GND or the voltage VN to the gates of the NMOS transistors $Qn_{23}$ to $Qn_{2n}$.

That is, in the third to nth CMOS pairs, when each of the switches $SW_{13}$ to $SW_{1n}$ is changed to the voltage VP side, a current flows through the PMOS transistors, and when each of the switches $SW_{13}$ to $SW_{1n}$ is changed to the voltage Vdd side, no current flows through the PMOS transistors. When each of the switches $SW_{23}$ to $SW_{2n}$ is changed to the voltage VN side, current flows through the NMOS transistors, and when each of the switches $SW_{23}$ to $SW_{2n}$ is changed to the ground GND side, no current flows through the NMOS transistors.

In each of the CMOS pairs, a gate connection point is connected with the input terminal 121, and a drain connection point is connected with the output terminal 122. A resistance R0 used as a so-called feedback resistance and reducing a DC offset is connected between the input terminal 121 and the output terminal 122. The output terminal 122 is connected with a load 125.

Incidentally, in the example of the amplifier circuit 112 of FIG. 3, description has been made of n (n is a natural number) CMOS pairs. However, for the convenience of description, in the present embodiment, description will be made of a constitution of four CMOS pairs (first to fourth CMOS pairs). That is, the number of CMOS pairs does not limit the present invention.

The operation of the amplifier circuit 112 will next be described.

Incidentally, suppose that two PMOS transistors forming a CMOS pair as described above (for example the PMOS transistor $Qp_{11}$ and the PMOS transistor $Qp_{21}$ of the first CMOS pair or the like) are of an identical shape, and that similarly two NMOS transistors (for example the NMOS transistor $Qn_{11}$ and the NMOS transistor $Qn_{21}$ of the first CMOS pair or the like) are of an identical shape.

In the first CMOS pair, let MP1 be the conversion coefficient of the PMOS transistors and VTP1 be the threshold voltage of the PMOS transistors, and let MN1 be the conversion coefficient of the NMOS transistors and VTN1 be the threshold voltage of the NMOS transistors. Also letting IP1 be the operating current of the PMOS transistors, and IN1 be the operating current of the NMOS transistors, the operating current IP1 is expressed by Equation (1) and the operating current IN1 is expressed by Equation (2) according to selections of the switch $SW_{11}$ and the switch $SW_{21}$.

[Equation 1]
$$IP1 = \begin{cases} \dfrac{MP1}{2}(Vcp - VTP1)^2 & (SW_{11} = VP) \\ 0 & (SW_{11} = Vdd) \end{cases} \quad (1)$$

[Equation 2]
$$IN1 = \begin{cases} \dfrac{MN1}{2}(Vcn - VTN1)^2 & (SW_{21} = VN) \\ 0 & (SW_{21} = GND) \end{cases} \quad (2)$$

Similarly, the currents IP2 and IN2 of the second CMOS pair are respectively expressed by Equation (3) and Equation (4) according to selections of the switch $SW_{12}$ and the switch $SW_{22}$.

[Equation 3]
$$IP2 = \begin{cases} \dfrac{MP2}{2}(Vcp - VTP2)^2 & (SW_{12} = VP) \\ 0 & (SW_{12} = Vdd) \end{cases} \quad (3)$$

[Equation 4]
$$IN2 = \begin{cases} \dfrac{MN2}{2}(Vcn - VTN2)^2 & (SW_{22} = VN) \\ 0 & (SW_{22} = GND) \end{cases} \quad (4)$$

Incidentally, in Equation (3), MP2 and VTP2 respectively denote the conversion coefficient and threshold voltage of the PMOS transistors of the second CMOS pair. In Equation (4), MN2 and VTN2 respectively denote the conversion coefficient and threshold voltage of the NMOS transistors of the second CMOS pair.

Further, similarly, the currents IP3 and IN3 of the third CMOS pair are respectively expressed by Equation (5) and Equation (6) according to selections of the switch $SW_{13}$ and the switch $SW_{23}$.

[Equation 5]
$$IP3 = \begin{cases} \dfrac{MP3}{2}(Vcp - VTP3)^2 & (SW_{13} = VP) \\ 0 & (SW_{13} = Vdd) \end{cases} \quad (5)$$

[Equation 6]
$$IN3 = \begin{cases} \dfrac{MN3}{2}(Vcn - VTN3)^2 & (SW_{23} = VN) \\ 0 & (SW_{23} = GND) \end{cases} \quad (6)$$

Incidentally, in Equation (5), MP3 and VTP3 respectively denote the conversion coefficient and threshold voltage of the PMOS transistors of the third CMOS pair. In Equation (6), MN3 and VTN3 respectively denote the conversion coefficient and threshold voltage of the NMOS transistors of the third CMOS pair.

In addition, similarly, the currents IP4 and IN4 of the fourth CMOS pair are respectively expressed by Equation (7) and Equation (8) according to selections of the switch $SW_{14}$ and the switch $SW_{24}$.

[Equation 7]
$$IP4 = \begin{cases} \dfrac{MP4}{2}(Vcp - VTP4)^2 & (SW_{14} = VP) \\ 0 & (SW_{14} = Vdd) \end{cases} \quad (7)$$

[Equation 8]
$$IN4 = \begin{cases} \dfrac{MN4}{2}(Vcn - VTN4)^2 & (SW_{24} = VN) \\ 0 & (SW_{24} = GND) \end{cases} \quad (8)$$

Incidentally, in Equation (7), MP4 and VTP4 respectively denote the conversion coefficient and threshold voltage of the PMOS transistors of the fourth CMOS pair. In Equation (8), MN4 and VTN4 respectively denote the conversion coefficient and threshold voltage of the NMOS transistors of the fourth CMOS pair.

Hence, from Equations (1) to (8), a total offset current I0 of the four CMOS pairs in the amplifier circuit 112 of FIG. 3 is expressed by the following equation.

[Equation 9]
$$I0 = (IP1 + IP2 + IP3 + IP4) - (IN1 + IN2 + IN3 + IN4) \quad (9)$$

That is, as shown in Equation (9), the offset current I0 is obtained by determining a difference between the value of a current sum of the PMOS transistors and the value of a current sum of the NMOS transistors.

Thus, due to MOS variations at a time of manufacturing, variance occurs in the conversion coefficient MPn, the threshold voltage VTPn, the conversion coefficient MNn, and the threshold voltage VTNn (n is a natural number) described above, resulting in a deviation between the current of the PMOS transistors and the current of the NMOS transistors, so that the offset current I0 is varied. However, the amplifier circuit 112 in the present embodiment can minimize the offset current I0 by selecting the switches (the switches $SW_{11}$ to $SW_{1n}$ and the switches $SW_{21}$ to $SW_{2n}$ in the example of FIG. 3) for changing gate voltage on the basis of control bits from the adjustment controlling unit 114.

Specifically, in the amplifier circuit 112, a highest current flows through the PMOS transistors when all the switches $SW_{11}$ to $SW_{1n}$ are turned on (when all the switches $SW_{11}$ to $SW_{1n}$ are changed to the voltage VP side), and a highest current flows through the NMOS transistors when all the switches $SW_{21}$ to $SW_{2n}$ are turned on (when all the switches $SW_{21}$ to $SW_{2n}$ are changed to the voltage VN side). Hence, for example, when a ratio between the operating current IP of the PMOS transistors and the operating current IN of the NMOS transistors is "Operating Current IP:Operating Current IN=2: 1", only one switch $SW_{11}$ of the switches $SW_{11}$ to $SW_{1n}$ on the PMOS transistor side is turned on, and two switches $SW_{21}$ and $SW_{22}$ of the switches $SW_{21}$ to $SW_{2n}$ on the NMOS transistor side are turned on, whereby the current flowing through the PMOS transistors and the current flowing through the NMOS transistors coincide with each other. Therefore the offset current I0 can be minimized.

In other words, it can also be said that the switches $SW_{11}$ to $SW_{1n}$ and the switches $SW_{21}$ to $SW_{2n}$ perform switching operation so as to eliminate an imbalance between the operating current IP of the PMOS transistors and the operating current IN of the NMOS transistors in the plurality of CMOS pairs.

Incidentally, in the present embodiment, description has been made of an example of four CMOS pairs. In the amplifier circuit 112, however, the larger the number of CMOS pairs, the larger the number of switches, thus enabling finer current adjustment.

Consideration being next given to mutual conductance mg0 at a time of a small signal, the mutual conductance gmp1 of the PMOS transistors in the first CMOS pair is expressed by Equation (10) according to selections of the switch $SW_{11}$.

[Equation 10]

$$gmp1 = \begin{cases} MP1(Vcp - VTP1) & (SW_{11} = VP) \\ 0 & (SW_{11} = Vdd) \end{cases} \quad (10)$$

In addition, similarly, the mutual conductances gmp2, gmp3, and gmp4 of the PMOS transistors in the second CMOS pair, the third CMOS pair, and the fourth CMOS pair are expressed by Equations (11) to (13) according to selections of the switch $SW_{12}$, the switch $SW_{13}$, and the switch $SW_{14}$, respectively.

[Equation 11]

$$gmp2 = \begin{cases} MP2(Vcp - VTP2) & (SW_{12} = VP) \\ 0 & (SW_{12} = Vdd) \end{cases} \quad (11)$$

[Equation 12]

$$gmp3 = \begin{cases} MP3(Vcp - VTP3) & (SW_{13} = VP) \\ 0 & (SW_{13} = Vdd) \end{cases} \quad (12)$$

[Equation 13]

$$gmp4 = \begin{cases} MP4(Vcp - VTP4) & (SW_{14} = VP) \\ 0 & (SW_{14} = Vdd) \end{cases} \quad (13)$$

Similarly, the mutual conductance gmn1 of the NMOS transistors in the first CMOS pair is expressed by Equation (14) according to selections of the switch $SW_{21}$.

[Equation 14]

$$gmn1 = \begin{cases} MN1(Vcn - VTN1) & (SW_{21} = VN) \\ 0 & (SW_{21} = GND) \end{cases} \quad (14)$$

In addition, similarly, the mutual conductances gmn2, gmn3, and gmn4 of the NMOS transistors in the second CMOS pair, the third CMOS pair, and the fourth CMOS pair are expressed by Equations (15) to (17) according to selections of the switch $SW_{22}$, the switch $SW_{23}$, and the switch $SW_{24}$, respectively.

[Equation 15]

$$gmn2 = \begin{cases} MN2(Vcn - VTN2) & (SW_{22} = VN) \\ 0 & (SW_{22} = GND) \end{cases} \quad (15)$$

[Equation 16]

$$gmn3 = \begin{cases} MN3(Vcn - VTN3) & (SW_{23} = VN) \\ 0 & (SW_{23} = GND) \end{cases} \quad (16)$$

[Equation 17]

$$gmn4 = \begin{cases} MN4(Vcn - VTN4) & (SW_{24} = VN) \\ 0 & (SW_{24} = GND) \end{cases} \quad (17)$$

Incidentally, MP1 to MP4, VTP1 to VTP4, MN1 to MN4, and VTN1 to VTN4 in Equations (10) to (17) are respectively the same coefficients as MP1 to MP4, VTP1 to VTP4, MN1 to MN4, and VTN1 to VTN4 in Equations (1) to (8).

Thus, from Equations (10) to (17), the mutual conductance gm0 of the four CMOS pairs is expressed by the following equation.

[Equation 18]

$$gm0 = gmp1 + gmp2 + gmp3 + gmp4 + gmn1 + gmn2 + gmn3 + gmn4 \quad (18)$$

That is, as shown in Equation (18), the mutual conductance gm0 is obtained by adding together the value of a sum of the mutual conductances gm of the PMOS transistors and the value of a sum of the mutual conductances gm of the NMOS transistors.

Thus, due to MOS variations at a time of manufacturing, variance occurs in the conversion coefficient MPn, the threshold voltage VTPn, the conversion coefficient MNn, and the threshold voltage VTNn (n is a natural number) described above, resulting in a deviation between the mutual conductance (gmp1 to gmp4 in the above example) of the PMOS transistors and the mutual conductance (gmn1 to gmn4 in the above example) of the NMOS transistors, so that the mutual conductance gm0 is varied. However, the amplifier circuit 112 in the present embodiment can optimize the mutual conductance gm0 by selecting the switches (the switches $SW_{11}$ to $SW_{1n}$ and the switches $SW_{21}$ to $SW_{2n}$ in the example of FIG. 3) for changing gate voltage on the basis of control bits from the adjustment controlling unit 114.

In other words, it can also be said that the amplifier circuit 112 controls gain by changing the switches and thereby optimizing the mutual conductance gm0.

As described above, in the present embodiment, although the offset current I0 and the mutual conductance gm0 defining the operating performance of the MOS circuit are varied because of variance in the conversion coefficient MPn, the threshold voltage VTPn, the conversion coefficient MNn, and the threshold voltage VTNn (n is a natural number) due to MOS variations at a time of manufacturing, the offset current I0 and the mutual conductance gm0 can be optimized by selecting the switches for selecting gate voltage on the basis of control bits from the adjustment controlling unit 114.

An example of another configuration of the amplifier circuit 112 in FIG. 3 will next be described with reference to a circuit diagram of FIG. 4.

Figure 4:
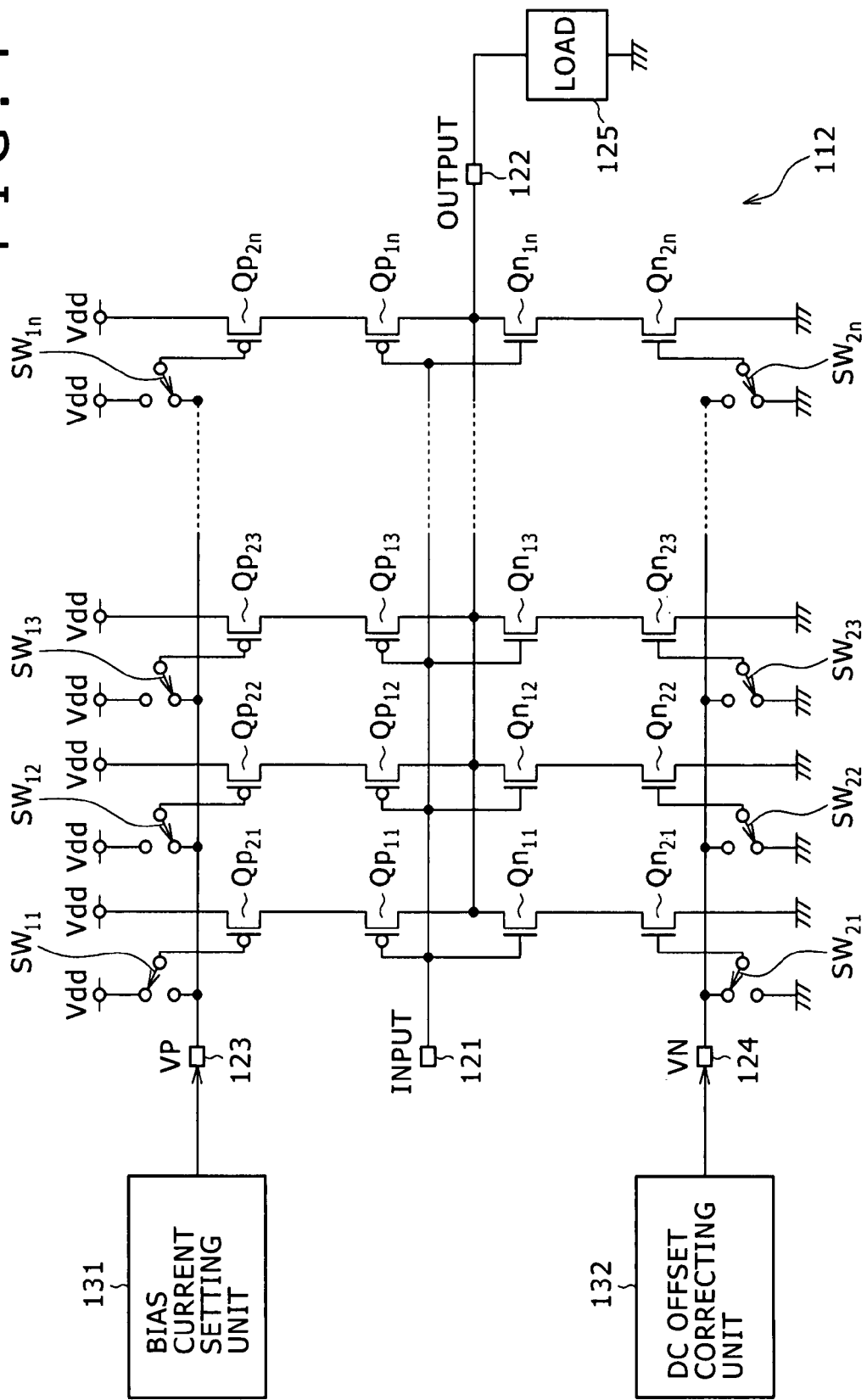
FIG. 4 is a circuit diagram showing an example of another configuration of the amplifier circuit of FIG. 2.

Incidentally, in the amplifier circuit 112 of FIG. 4, the same parts as in the amplifier circuit 112 of FIG. 3 are identified by the same reference numerals, and repeated description of parts performing the same operation will be omitted.

Specifically, the amplifier circuit 112 of FIG. 4 is different from the amplifier circuit 112 of FIG. 3 in that the amplifier circuit 112 of FIG. 4 has a bias current setting unit 131 connected to a terminal 123 and a DC offset correcting unit 132 connected to a terminal 124 in place of the variable voltage source E1 and the variable voltage source E2. However, the other configuration of the amplifier circuit 112 of FIG. 4 is the same as that of the amplifier circuit 112 of FIG. 3. Incidentally, as compared with the amplifier circuit 112 of FIG. 3, the amplifier circuit 112 of FIG. 4 does not have a resistance R0. This is because the amplifier circuit 112 of FIG. 4 has the DC offset correcting unit 132 and thus does not need to feed back voltage.

The bias current setting unit 131 sets a bias current by providing a voltage VP (PMOS bias setting voltage).

Thus, the amplifier circuit 112 of FIG. 4 can achieve a precise setting of mutual conductance gm by not only optimizing mutual conductance gm0 by selecting switches (switches $SW_{11}$ to $SW_{1n}$ and switches $SW_{21}$ to $SW_{2n}$ in the example of FIG. 4) for changing gate voltage on the basis of control bits from an adjustment controlling unit 114 but also setting the bias current by the bias current setting unit 131.

The DC offset correcting unit 132 corrects a DC offset by providing a voltage VN (NMOS bias setting voltage).

Thus, the amplifier circuit 112 of FIG. 4 can achieve a precise offset reduction by not only minimizing offset current I0 by selecting the switches (the switches $SW_{11}$ to $SW_{1n}$ and the switches $SW_{21}$ to $SW_{2n}$ in the example of FIG. 4) for changing gate voltage on the basis of control bits from the adjustment controlling unit 114 but also correcting the DC offset by the DC offset correcting unit 132.

As described above, in addition to optimizing the mutual conductance gm0 and minimizing the offset current I0 by selecting the switches for changing gate voltage, the amplifier circuit 112 of FIG. 4 further sets the bias current by the bias current setting unit 131 to thereby achieve a precise setting of the mutual conductance gm, and further corrects the DC offset by the DC offset correcting unit 132 to thereby achieve a precise offset reduction.

An example of yet another configuration of the amplifier circuit 112 in FIG. 3 will next be described with reference to a circuit diagram of FIG. 5.

Figure 5:
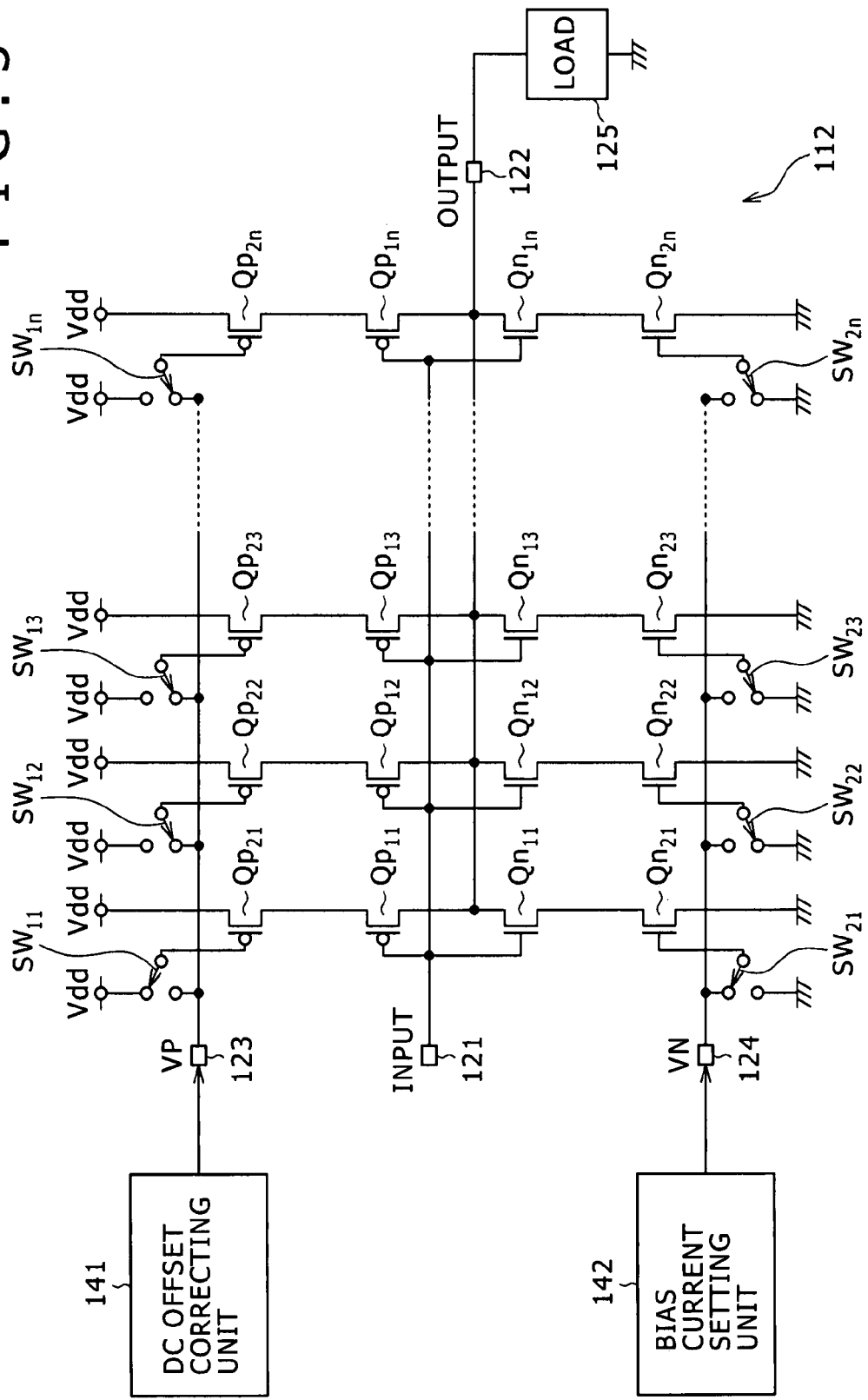
FIG. 5 is a circuit diagram showing an example of another configuration of the amplifier circuit of FIG. 2.

Incidentally, in the amplifier circuit 112 of FIG. 5, the same parts as in the amplifier circuit 112 of FIG. 3 are identified by the same reference numerals, and repeated description of parts performing the same operation will be omitted.

Specifically, the amplifier circuit 112 of FIG. 5 is different from the amplifier circuit 112 of FIG. 3 in that the amplifier circuit 112 of FIG. 5 has a DC offset correcting unit 141 connected to a terminal 123 and a bias current setting unit 142 connected to a terminal 124 in place of the variable voltage source E1 and the variable voltage source E2. However, the other configuration of the amplifier circuit 112 of FIG. 5 is the same as that of the amplifier circuit 112 of FIG. 3.

In other words, it can also be said that as compared with the amplifier circuit 112 of FIG. 4 described as another configuration of the amplifier circuit 112 of FIG. 3, the amplifier circuit 112 of FIG. 5 has the DC offset correcting unit 141 connected to the terminal 123 in place of the bias current setting unit 131, and has the bias current setting unit 142 connected to the terminal 124 in place of the DC offset correcting unit 132.

The DC offset correcting unit 141 corrects a DC offset by providing a voltage VP (PMOS bias setting voltage).

Thus, the amplifier circuit 112 of FIG. 5 can achieve a precise offset reduction by not only minimizing offset current I0 by selecting switches (switches $SW_{11}$ to $SW_{1n}$ and switches $SW_{21}$ to $SW_{2n}$ in the example of FIG. 5) for changing gate voltage on the basis of control bits from an adjustment controlling unit 114 but also correcting the DC offset by the DC offset correcting unit 141.

The bias current setting unit 142 sets a bias current by providing a voltage VN (NMOS bias setting voltage).

Thus, the amplifier circuit 112 of FIG. 5 can achieve a precise setting of mutual conductance gm by not only optimizing mutual conductance gm0 by selecting the switches (the switches $SW_{11}$ to $SW_{1n}$ and the switches $SW_{21}$ to $SW_{2n}$ in the example of FIG. 5) for changing gate voltage on the basis of control bits from the adjustment controlling unit 114 but also setting the bias current by the bias current setting unit 142.

As described above, in addition to optimizing the mutual conductance gm0 and minimizing the offset current I0 by selecting the switches for changing gate voltage, the amplifier circuit 112 of FIG. 5 further corrects the DC offset by the DC offset correcting unit 141 to thereby achieve a precise offset reduction, and further sets the bias current by the bias current setting unit 142 to thereby achieve a precise setting of the mutual conductance gm.

An example of a detailed configuration of the bias current setting unit 131 and the DC offset correcting unit 132 in the amplifier circuit 112 of FIG. 4 will next be described with reference to a circuit diagram of FIG. 6.

Figure 6:
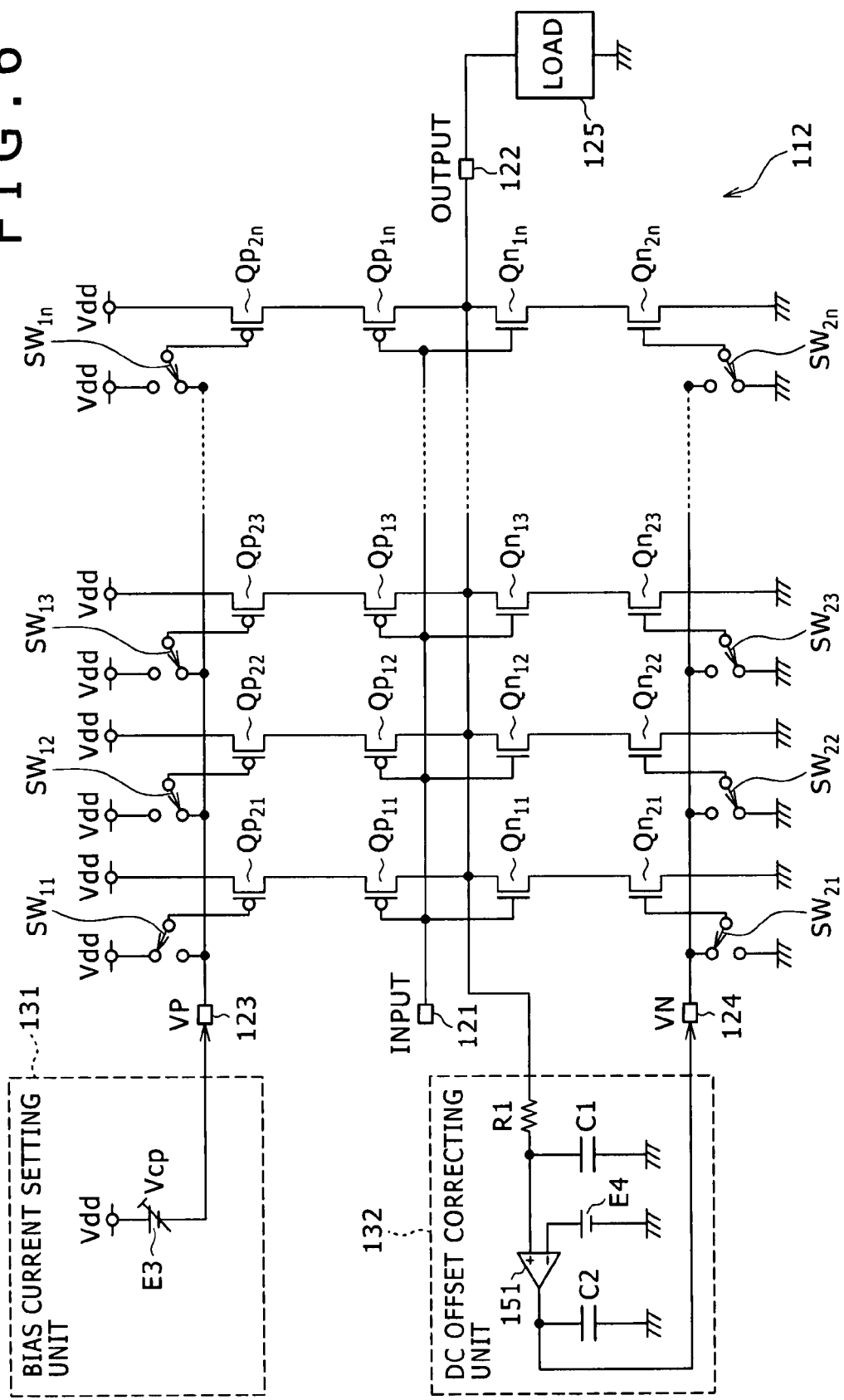
FIG. 6 is a circuit diagram showing an example of a detailed configuration of a bias current setting unit and a DC offset correcting unit.

Incidentally, in the amplifier circuit 112 of FIG. 6, the same parts as in the amplifier circuit 112 of FIG. 4 are identified by the same reference numerals, and repeated description of parts performing the same operation will be omitted.

In the bias current setting unit 131, a variable voltage source E3 is provided between the power supply voltage source (Vdd) and the terminal 123. That is, a variable voltage Vcp from the variable voltage source E3 is applied as voltage VP (PMOS bias setting voltage) to the terminal 123.

Thus, the bias current setting unit 131 sets a bias current by applying the voltage VP, which is the variable voltage Vcp from the variable voltage source E3.

The DC offset correcting unit 132 in the example of FIG. 6 is a circuit having a low-pass filter for removing a signal component, the low-pass filter including a resistance R1 and a capacitor C1, and a comparing circuit including a comparator 151, a smoothing capacitor C2, and a reference voltage source E4.

The comparator 151 has a positive phase input (+) thereof connected to drain connection points and the output terminal 122 via the low-pass filter including the resistance R1 and the capacitor C1, and has a negative phase input (−) thereof connected to the reference voltage source E4. The comparator 151 has an output terminal thereof connected to the terminal 124.

The comparator 151 compares the level of a voltage input to the positive phase input (+) (a voltage of a DC component extracted by the low-pass filter including the resistance R1 and the capacitor C1) with the level of a voltage input to the negative phase input (−) (a voltage applied by the reference voltage source E4), and then outputs a voltage having a level representing a result of the comparison. The capacitor C2 smoothes the output voltage (pulsating voltage) from the comparator 151, and then outputs the smoothed output voltage to the terminal 124.

Thus, the DC offset correcting unit 132 corrects the DC offset by applying the output voltage from the comparator 151, which voltage is smoothed by the capacitor C2, as voltage VN (NMOS bias setting voltage).

It is to be noted that the circuit configurations of the bias current setting unit 131 and the DC offset correcting unit 132 described above with reference to FIG. 6 are one example; a current mirror circuit, for example, may be used in place of the variable voltage source E3 in the bias current setting unit 131, and another circuit that can correct the DC offset may be used in the DC offset correcting unit 132.

An example of a detailed configuration of the DC offset correcting unit 141 and the bias current setting unit 142 in the amplifier circuit 112 of FIG. 5 will next be described with reference to a circuit diagram of FIG. 7.

Figure 7:
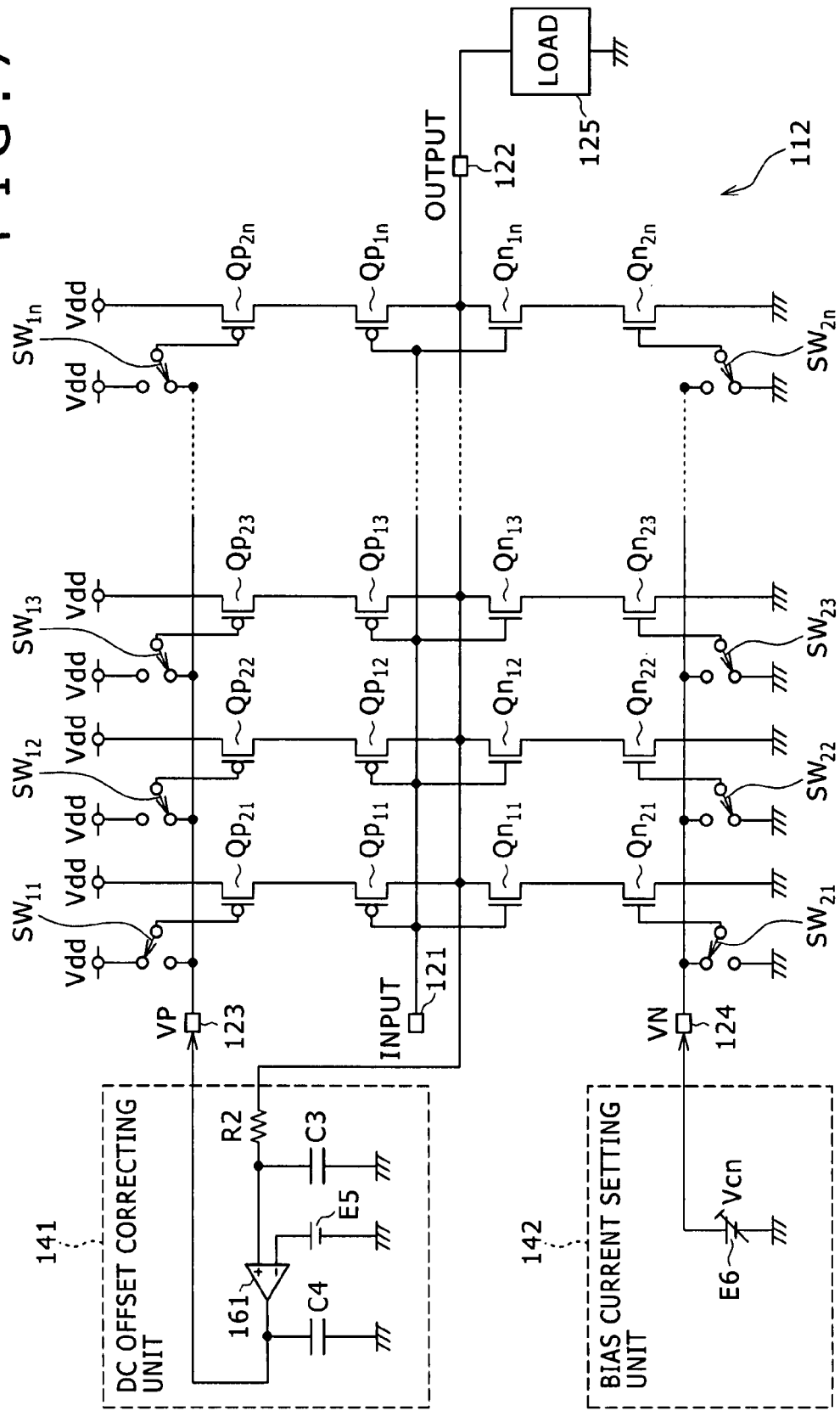
FIG. 7 is a circuit diagram showing an example of a detailed configuration of a bias current setting unit and a DC offset correcting unit.

Incidentally, in the amplifier circuit 112 of FIG. 7, the same parts as in the amplifier circuit 112 of FIG. 5 are identified by the same reference numerals, and repeated description of parts performing the same operation will be omitted.

In other words, it can also be said that as compared with the amplifier circuit 112 of FIG. 6 described as the detailed configuration of the bias current setting unit 131 and the DC offset correcting unit 132 in FIG. 4, the amplifier circuit 112 of FIG. 7 has the DC offset correcting unit 141 connected to the terminal 123 in place of the bias current setting unit 131, and has the bias current setting unit 142 connected to the terminal 124 in place of the DC offset correcting unit 132.

As with the DC offset correcting unit 132, the DC offset correcting unit 141 in the example of FIG. 7 is a circuit having a low-pass filter for removing a signal component, the low-pass filter including a resistance R2 and a capacitor C3, and a comparing circuit including a comparator 161, a smoothing capacitor C4, and a reference voltage source E5.

The comparator 161 has a positive phase input (+) thereof connected to drain connection points and the output terminal 122 via the low-pass filter including the resistance R2 and the capacitor C3, and has a negative phase input (−) thereof connected to the reference voltage source E5. The comparator 161 has an output terminal thereof connected to the terminal 123.

The comparator 161 compares the level of a voltage input to the positive phase input (+) (a voltage of a DC component extracted by the low-pass filter including the resistance R2 and the capacitor C3) with the level of a voltage input to the negative phase input (−) (a voltage applied by the reference voltage source E5), and then outputs a voltage having a level representing a result of the comparison. The capacitor C4 smoothes the output voltage (pulsating voltage) from the comparator 161, and then outputs the smoothed output voltage to the terminal 123.

Thus, the DC offset correcting unit 141 corrects the DC offset by applying the output voltage from the comparator 161, which voltage is smoothed by the capacitor C4, as voltage VP (PMOS bias setting voltage).

In the bias current setting unit 142, a variable voltage source E6 is provided between the ground GND and the terminal 124. That is, a variable voltage Vcn from the variable voltage source E6 is applied as voltage VN (NMOS bias setting voltage) to the terminal 124.

Thus, the bias current setting unit 142 sets a bias current by applying the voltage VN, which is the variable voltage Vcn from the variable voltage source E6.

It is to be noted that the circuit configurations of the DC offset correcting unit 141 and the bias current setting unit 142 described above with reference to FIG. 7 are one example; another circuit that can correct the DC offset may be used in the DC offset correcting unit 141, and a current mirror circuit, for example, may be used in place of the variable voltage source E6 in the bias current setting unit 142.

A process of controlling the switching operation of the switches in the amplifier circuit 112 by the measuring unit 113 and the adjustment controlling unit 114 will next be described with reference to a flowchart of FIG. 8.

In step S11, the measuring unit 113 measures the operating current IP of the PMOS transistors of the plurality of CMOS inverter circuits forming the amplifier circuit 112 and the operating current IN of the NMOS transistors from an output signal output from the amplifier circuit 112. The measuring unit 113 supplies a measured value to the adjustment controlling unit 114.

In step S12, on the basis of the measured value from the measuring unit 113, the adjustment controlling unit 114 generates control bits for controlling the operation of the switches $SW_{11}$ to $SW_{1n}$ and the switches $SW_{21}$ to $SW_{2n}$ so as to eliminate an imbalance between the operating current IP of the PMOS transistors and the operating current IN of the NMOS transistors.

Specifically, for example, the adjustment controlling unit 114 generates control bits for controlling the operation of the switches $SW_{11}$ to $SW_{1n}$ and the switches $SW_{21}$ to $SW_{2n}$ so as to minimize the value of an offset current I0 (for example (IP1+IP2+IP3+IP4)−(IN1+IN2+IN3+IN4)) as a difference between the value of the operating current IP (for example IP1+IP2+IP3+IP4), which is a sum of currents of the PMOS transistors in the plurality of CMOS inverter circuits, and the value of the operating current IN (for example IN1+IN2+IN3+IN4), which is a sum of currents of the NMOS transistors.

In addition, for example, the adjustment controlling unit 114 generates control bits for controlling the operation of the switches $SW_{11}$ to $SW_{1n}$ and the switches $SW_{21}$ to $SW_{2n}$ so as to optimize the value of a mutual conductance gm0 (for example gmp1+gmp2+gmp3+gmp4+gmn1+gmn2+gmn3+gmn4) obtained by adding together the value of a sum of mutual conductances of the PMOS transistors (for example gmp1+gmp2+gmp3+gmp4) in the plurality of CMOS inverter circuits and the value of a sum of mutual conductances of the NMOS transistors (for example gmn1+gmn2+gmn3+gmn4).

In step S13, the adjustment controlling unit 114 supplies the generated control bits to the amplifier circuit 112. Thereby the switching operation controlling process of FIG. 8 is ended.

Thus, in the amplifier circuit 112, the switches $SW_{11}$ to $SW_{1n}$ and the switches $SW_{21}$ to $SW_{2n}$ perform switching operation according to the control bits from the adjustment controlling unit 114, whereby an imbalance between the operating current IP of the PMOS transistors and the operating current IN of the NMOS transistors is eliminated. As a result, for example, the operating current IP, which is a sum of currents of the PMOS transistors, and the operating current IN, which is a sum of currents of the NMOS transistors, become equal to each other, so that the offset current I0 can be minimized.

As described above, in the amplifier circuit 112, the switches $SW_{11}$ to $SW_{1n}$ and the switches $SW_{21}$ to $SW_{2n}$ perform switching operation according to the control bits from the adjustment controlling unit 114, whereby the offset current I0 is minimized and the mutual conductance gm0 is optimized.

In regard to a method of controlling the switching operation of the switches $SW_{11}$ to $SW_{1n}$ and the switches $SW_{21}$ to $SW_{2n}$ in the amplifier circuit 112, it is possible to extract optimum bits at a time of factory inspection as control bits for controlling the switching operation, and control the switching operation using the optimum bits. The method of extracting optimum bits at a time of factory inspection and controlling the switching operation using the optimum bits will next be described with reference to FIG. 9.

Figure 9:
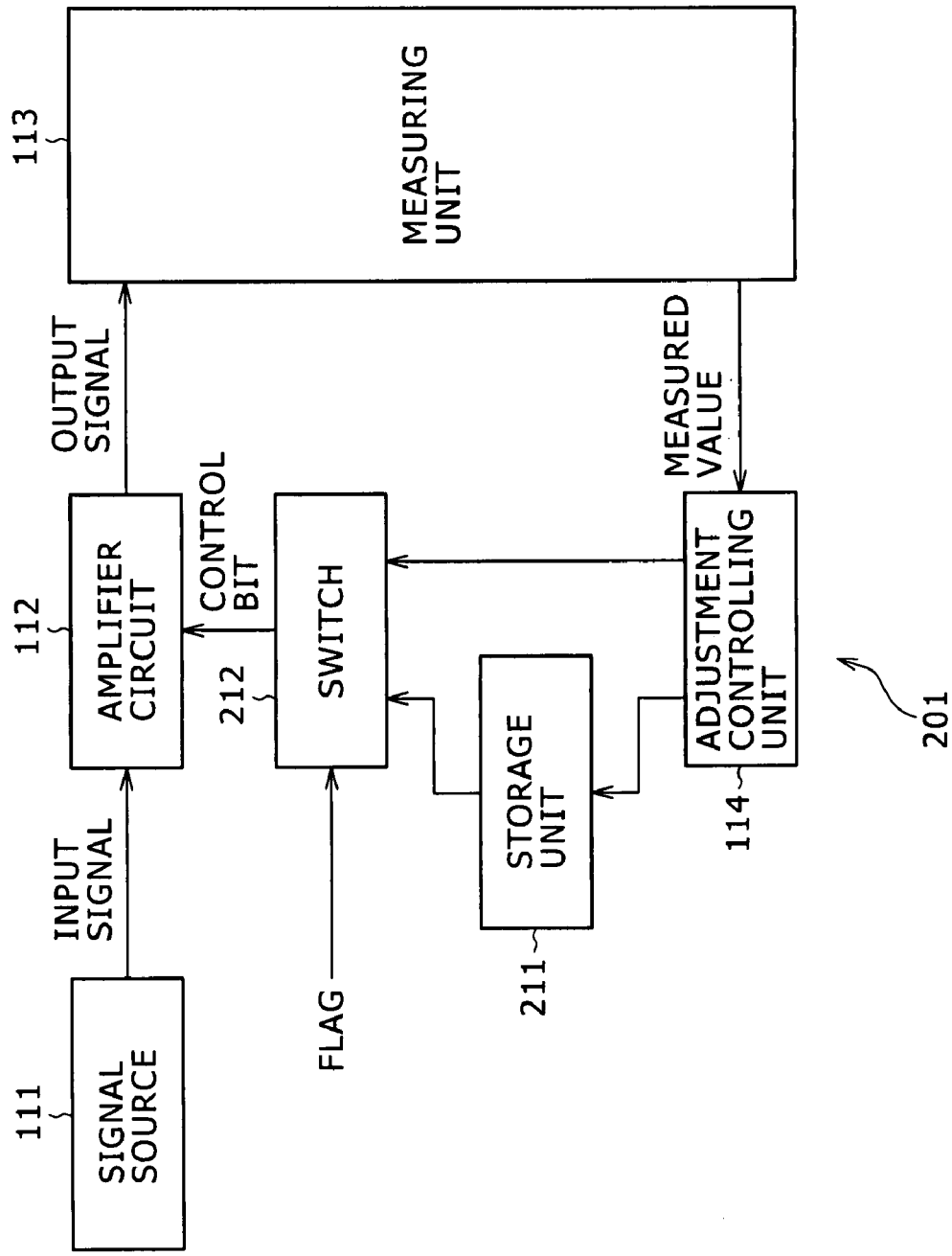
FIG. 9 is a block diagram showing another configuration of a semiconductor device to which the present invention is applied.

FIG. 9 is a block diagram showing another configuration of a semiconductor device to which the present invention is applied.

Incidentally, in the semiconductor device 201 of FIG. 9, the same parts as in the semiconductor device 101 of FIG. 2 are identified by the same reference numerals, and repeated description of parts performing the same operation will be omitted.

Specifically, the semiconductor device 201 of FIG. 9 is different from the semiconductor device 101 of FIG. 2 in that the semiconductor device 201 of FIG. 9 has a storage unit 211 and a switch 212 between an amplifier circuit 112 and an adjustment controlling unit 114. However, the other configuration of the semiconductor device 201 of FIG. 9 is the same as that of the semiconductor device 101 of FIG. 2.

On the basis of a measured value from a measuring unit 113, the adjustment controlling unit 114 generates control bits for controlling the operation of switches $SW_{11}$ to $SW_{1n}$ and switches $SW_{21}$ to $SW_{2n}$ so as to eliminate an imbalance between the operating current IP of PMOS transistors and the operating current IN of NMOS transistors in a plurality of CMOS inverter circuits. At a time of factory inspection, the adjustment controlling unit 114 supplies the generated control bits to the switch 212.

The switch 212 supplies the amplifier circuit 112 with the control bits supplied from the adjustment controlling unit 114 at the time of the factory inspection on the basis of an externally supplied flag. Thereby, in the amplifier circuit 112, the switches $SW_{11}$ to $SW_{1n}$ and the switches $SW_{21}$ to $SW_{2n}$ perform switching operation according to the control bits from the switch 212.

When the control bits generated on the basis of the measured value from the measuring unit 113 measuring an output signal from the amplifier circuit 112 become optimum bits, the adjustment controlling unit 114 stores the optimum control bits in the storage unit 211. Thereby the optimum control bits are stored in the storage unit 211 formed by a nonvolatile memory, for example.

At a subsequent time of shipment after completion of the factory inspection, in the semiconductor device 201, the flag for the switch 212 is changed so that an input for the control bits is changed from the adjustment controlling unit 114 side to the storage unit 211 side. That is, at the time of shipment of the semiconductor device 201, the measuring unit 113 and the adjustment controlling unit 114 are removed, and the flag for the switch 212 is selected to be fixed to the storage unit 211 side.

Thus, in the semiconductor device 201, at a time of use by a user, the switch 212 supplies the control bits stored in the storage unit 211 to the amplifier circuit 112. Then, the switches $SW_{11}$ to $SW_{1n}$ and the switches $SW_{21}$ to $SW_{2n}$ perform switching operation according to the control bits from the switch 212.

Thus, because optimum control bits can be stored in the storage unit 211 in advance at the time of factory inspection, the semiconductor device 201 can be of a configuration without the measuring unit 113 and the adjustment controlling unit 114.

As described above, as shown in FIG. 3, the present embodiment can control the offset current I0 by selecting the switches for changing gate voltage. The present embodiment can also control the mutual conductance gm0 by selecting the switches for changing gate voltage. As a result, it is possible to obtain gain while suppressing current distortion.

In addition, as shown in FIG. 3, although the offset current I0 and the mutual conductance gm0 defining the operating performance of the MOS circuit are varied because of variance in the conversion coefficient MPn, the threshold voltage VTPn, the conversion coefficient MNn, and the threshold voltage VTNn (n is a natural number) due to MOS variations at a time of manufacturing, the offset current I0 and the mutual conductance gm0 can be controlled to be optimized by selecting the switches for selecting gate voltage.

As shown in FIG. 4 and FIG. 5, it is possible to achieve a precise setting of the mutual conductance gm by not only optimizing the mutual conductance gm0 by selecting the switches for changing gate voltage but also setting the bias current, and achieve a precise offset reduction by not only minimizing the offset current I0 by selecting the switches for changing gate voltage but also correcting an offset.

As shown in FIG. 6 and FIG. 7, it is possible to achieve voltage control of a precise setting of the mutual conductance gm by not only optimizing the mutual conductance gm0 by selecting the switches for changing gate voltage but also setting the bias current. In addition, it is possible to achieve an offset reduction following the voltage control of the setting of the mutual conductance gm by setting the bias current, by not only minimizing the offset current I0 by selecting the switches for changing gate voltage but also correcting an offset in the comparing circuit.

It is to be noted that in the present specification, the steps describing a program stored on a recording medium include not only processes carried out in time series in the described order but also processes carried out in parallel or individually and not necessarily in time series.

In addition, embodiments of the present invention are not limited to the above-described embodiments, and various changes can be made without departing from the spirit of the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. An amplifier circuit comprising
a plurality of CMOS (Complementary Metal Oxide Semiconductor) inverter circuits connected in parallel with each other,
wherein said CMOS inverter circuits each include
a first PMOS (P-channel Metal Oxide Semiconductor) transistor,
a first NMOS (N-channel Metal Oxide Semiconductor) transistor having a drain connected to a drain of said first PMOS transistor,
a gate of said first PMOS transistor and a gate of said first NMOS transistor being connected to an input terminal, and the drain of said first PMOS transistor and the drain of said first NMOS transistor being connected to an output terminal, a second PMOS transistor having a drain connected to a source of said first PMOS transistor, and having a source connected to a power supply voltage source, a first switch connected to a gate of said second PMOS transistor, said first switch changing a gate voltage of said second PMOS transistor to one of a power supply voltage and a first operating voltage, a second NMOS transistor having a drain connected to a source of said first NMOS transistor, and having a source connected to a ground, and a second switch connected to a gate of said second NMOS transistor, said second switch changing a gate voltage of said second NMOS transistor to one of a potential of said ground and a second operating voltage, and said first switch and said second switch perform switching operation so as to eliminate an imbalance between first operating currents of the PMOS transistors and second operating currents of the NMOS transistors in the plurality of said CMOS inverter circuits.

2. The amplifier circuit according to claim 1,
wherein said first switch and said second switch perform switching operation so as to minimise a value of offset current as a difference between a value of a current sum of said first operating currents and a value of a current sum of said second operating currents.

3. The amplifier circuit according to claim 1,
wherein said first switch and said second switch perform switching operation so as to optimize a value of mutual conductance obtained by adding together a value of a sum of mutual conductances of the PMOS transistors and a value of a sum of mutual conductances of the NMOS transistors in the plurality of said CMOS inverter circuits.

4. The amplifier circuit according to claim 1, further comprising:
bias current setting means for setting a bias current by applying said first operating voltage; and
DC (Direct Current) offset correcting means for correcting a DC offset by applying said second operating voltage.

5. The amplifier circuit according to claim 1, further comprising:
DC offset correcting means for correcting a DC offset by applying said first operating voltage; and
bias current setting means for setting a bias current by applying said second operating voltage.

6. The amplifier circuit according to claim 4,
wherein said bias current setting means is formed by a variable voltage source disposed between the gate of said second PMOS transistor and said power supply voltage source, and
when said first switch is changed to a side of said variable voltage source, said variable voltage source applies a variable voltage to the gate of said second PMOS transistor as said first operating voltage.

7. The amplifier circuit according to claim 4,
wherein said DC off set correcting means is formed by a filter for removing high frequencies and an operational amplifier, and
when said second switch is changed to a side of said operational amplifier, said operational amplifier compares a level of a voltage extracted by said filter with a level of a voltage applied by a reference voltage source, and applies a voltage having a level representing a result of comparison to the gate of said second NMOS transistor as said second operating voltage.

8. The amplifier circuit according to claim 5,
wherein said DC offset correcting means is formed by a filter for removing high frequencies and an operational amplifier, and
when said first switch is changed to a side of said operational amplifier, said operational amplifier compares a level of a voltage extracted by said filter with a level of a voltage applied by a reference voltage source, and applies a voltage having a level representing a result of comparison to the gate of said second PMOS transistor as said first operating voltage.

9. The amplifier circuit according to claim 5,
wherein said bias current setting means is formed by a variable voltage source disposed between the gate of said second NMOS transistor and said ground, and
when said second switch is changed to a side of said variable voltage source, said variable voltage source applies a variable voltage to the gate of said second NMOS transistor as said second operating voltage.

10. The amplifier circuit according to claim 1, further comprising a feedback resistance for reducing an offset between said input terminal and said output terminal.

11. A semiconductor device comprising:
the amplifier circuit of claim 1;
measuring means for measuring an output from said amplifier circuit; and
controlling means for controlling the switching operation of said first switch and said second switch so as to eliminate an imbalance between said first operating currents of the PMOS transistors and said second operating currents of the NMOS transistors in the plurality of said CMOS inverter circuits on a basis of the measured output.

12. The semiconductor device according to claim 11,
wherein said controlling means controls the switching operation of said first switch and said second switch so as to minimize a value of offset current as a difference between a value of a current sum of said first operating currents and a value of a current sum of said second operating currents.

13. The semiconductor device according to claim 11,
wherein said controlling means controls the switching operation of said first switch and said second switch so as to optimize a value of mutual conductance obtained by adding together a value of a sum of mutual conductances of the PMOS transistors and a value of a sum of mutual conductances of the NMOS transistors in the plurality of said CMOS inverter circuits.

14. A controlling method of a semiconductor device, said semiconductor device including the amplifier circuit of claim 1, said controlling method comprising the steps of:
measuring an output from said amplifier circuit; and
controlling the switching operation of said first switch and said second switch so as to eliminate an imbalance between said first operating currents of the PMOS transistors and said second operating currents of the NMOS transistors in the plurality of said CMOS inverter circuits on a basis of the measured output.

* * * * *